United States Patent
Nonogaki et al.

(10) Patent No.: US 10,648,868 B2
(45) Date of Patent: May 12, 2020

(54) SURFACE ACOUSTIC WAVE DEVICE

(71) Applicant: CITIZEN WATCH CO., LTD., Tokyo (JP)

(72) Inventors: Youichi Nonogaki, Hachiouji (JP); Yoshitaka Kinoshita, Tokyo (JP); Takashi Akahane, Tokorozawa (JP); Satoshi Sohda, Kawagoe (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 230 days.

(21) Appl. No.: 15/539,157

(22) PCT Filed: Dec. 24, 2015

(86) PCT No.: PCT/JP2015/086141
§ 371 (c)(1),
(2) Date: Jun. 23, 2017

(87) PCT Pub. No.: WO2016/104659
PCT Pub. Date: Jun. 30, 2016

(65) Prior Publication Data
US 2017/0350769 A1    Dec. 7, 2017

(30) Foreign Application Priority Data

Dec. 24, 2014  (JP) .................... 2014-261044

(51) Int. Cl.
*G01K 11/26* (2006.01)
*H03H 9/02* (2006.01)
(Continued)

(52) U.S. Cl.
CPC .............. *G01K 11/265* (2013.01); *G01K 7/32* (2013.01); *H01L 41/107* (2013.01); *H01L 41/18* (2013.01);
(Continued)

(58) Field of Classification Search
CPC ...... G01K 11/265; G01K 7/32; H01L 41/107; H01L 41/18; H01L 41/41; H03H 9/02543; H03H 9/25; H03H 9/642
See application file for complete search history.

(56) References Cited

U.S. PATENT DOCUMENTS 3,983,515 A * 9/1976 Mitchell .................. H03H 3/08
                                                            333/151
4,232,240 A * 11/1980 O'Connell ............ H01L 41/187
                                                            310/313 A
(Continued)

FOREIGN PATENT DOCUMENTS

CN        1105166 A      7/1995
CN        1272000 A      11/2000
(Continued)

OTHER PUBLICATIONS

English translation of the International Search Report for PCT/JP2015/086141.
(Continued)

*Primary Examiner* — Lisa M Caputo
*Assistant Examiner* — Philip L Cotey
(74) *Attorney, Agent, or Firm* — HEA Law PLLC

(57) ABSTRACT

Provided is a surface acoustic wave device using a novel and steadily suppliable piezoelectric material that is resistant to a high-temperature environment and enables the surface acoustic wave device to use a 2 GHz to 2.5 GHz band or higher. The surface acoustic wave device includes: a piezoelectric substrate formed from a monocrystal of gehlenite (CAS: Ca2Al(AlSi)O7); and interdigital transducers formed on a surface acoustic wave propagation plane of the piezoelectric substrate.

3 Claims, 19 Drawing Sheets

(51) Int. Cl.
  *G01K 7/32*    (2006.01)
  *H03H 9/25*    (2006.01)
  *H01L 41/107*  (2006.01)
  *H01L 41/18*   (2006.01)
  *H03H 9/64*    (2006.01)
  *H01L 41/41*   (2013.01)

(52) U.S. Cl.
  CPC .......... *H03H 9/02543* (2013.01); *H03H 9/25* (2013.01); *H03H 9/642* (2013.01); *H01L 41/41* (2013.01)

(56) References Cited

U.S. PATENT DOCUMENTS

| | | | | |
|---|---|---|---|---|
| 4,409,571 A * | 10/1983 | Milsom | ............... | H03H 9/02559 310/313 A |
| 4,672,255 A * | 6/1987 | Suzuki | ............... | H03H 9/02543 310/313 A |
| 5,694,096 A | 12/1997 | Ushiroku et al. | | |
| 5,821,673 A * | 10/1998 | Pisarevsky | ........... | H03H 9/0259 310/360 |
| 6,462,632 B1 | 10/2002 | Fujii et al. | | |
| 6,538,359 B1 * | 3/2003 | Hiraku | ............... | H03H 9/02574 310/313 R |
| 8,378,553 B1 * | 2/2013 | Naumenko | ........ | H03H 9/02559 310/313 A |
| 9,522,827 B2 * | 12/2016 | Tsurumi | .................... | G01L 1/16 |
| 2002/0067227 A1 * | 6/2002 | Naumenko | ........ | H03H 9/02559 333/193 |
| 2003/0080831 A1 * | 5/2003 | Naumenko | ........ | H03H 9/02559 333/193 |
| 2003/0164657 A1 * | 9/2003 | Inoue | ................. | H03H 9/02543 310/313 A |
| 2003/0234705 A1 * | 12/2003 | Abbott | ............... | H03H 9/02559 333/193 |
| 2006/0108894 A1 * | 5/2006 | Kanna | ................ | H03H 9/02543 310/313 A |
| 2007/0132339 A1 * | 6/2007 | Nishiyama | ............... | H03H 3/10 310/313 R |
| 2009/0295508 A1 * | 12/2009 | Isobe | ................... | H03H 9/0222 333/195 |
| 2011/0279187 A1 * | 11/2011 | Ballandras | ......... | H03H 9/02031 331/154 |
| 2012/0068573 A1 * | 3/2012 | Obata | ................ | H03H 9/02551 310/313 A |
| 2014/0327340 A1 * | 11/2014 | Tsurumi | .................... | G01L 1/16 310/338 |
| 2015/0013461 A1 * | 1/2015 | Pollard | ............... | H01L 41/1132 73/579 |
| 2015/0303895 A1 * | 10/2015 | Ballandras | ............ | H01L 41/047 310/313 R |
| 2016/0031757 A1 * | 2/2016 | Atakan | ................. | C04B 7/3453 106/640 |
| 2018/0155248 A1 * | 6/2018 | McCandlish | ............. | B28B 1/00 |

FOREIGN PATENT DOCUMENTS

| | | |
|---|---|---|
| JP | 2004-129185 A | 4/2004 |
| JP | 2004-242044 A | 8/2004 |
| JP | 2008-267847 A | 11/2008 |
| JP | 4470590 B2 | 6/2010 |
| JP | 2012-255706 A | 12/2012 |
| JP | 2014-011327 A | 1/2014 |

OTHER PUBLICATIONS

Office Action dated Feb. 3, 2020, for corresponding CN Patent Application No. 201580071137.9.

* cited by examiner

SURFACE ACOUSTIC WAVE DEVICE

CROSS REFERENCE TO RELATED APPLICTATIONS

This application is a National Stage of International Application No. PCT/JP2015/086141 filed on Dec. 24, 2015, which claims priority from Japanese Patent Application 2014-261044, filed on Dec. 24, 2014. The contents of the above documents are incorporated herein by reference in their entirety.

TECHNICAL FIELD

The present invention relates to a surface acoustic wave device.

BACKGROUND ART

Known applications of surface acoustic wave devices utilizing surface acoustic waves include so-called band pass filters, and sensors configured to remotely measure temperatures or pressures of measurement targets.

For example, a wireless temperature measuring sensor utilizing a surface acoustic wave (SAW) is disclosed in Patent Literature 1. In Patent Literature 1, there is a description that the disclosed sensor is also applicable as various sensors other than a temperature sensor, including a pressure sensor, a displacement sensor, a humidity sensor, and a gas chromatography sensor. Quartz, lithium tantalate, lithium tetraborate, and langasite, in addition to lithium niobate, are given as examples of a piezoelectric material used in the disclosed sensor.

In Patent Literature 2, a surface acoustic wave sensor adaptable to wireless applications is disclosed, which uses langatate as a piezoelectric material.

CITATION LIST

Patent Literature

[Patent Literature 1] JP 2004-129185 A
[Patent Literature 2] JP 4470590 B2

SUMMARY OF INVENTION

Technical Problem

The various piezoelectric materials that are given in the patent literatures cited above are unsuitable as a constituent material for some uses of a surface acoustic wave device. For example, quartz, which is a typical piezoelectric material, has a β transition at 573° C., thereby losing piezoelectricity, and thus cannot be used in a high-temperature environment. Langasite and langatate, on the other hand, have no phase transitions and retain piezoelectricity until the temperature approaches 1,500° C. However, the surface acoustic waves of langasite and langatate have an acoustic velocity of around 2,500 m/s, which is slower than those of other materials.

The frequency of a surface acoustic wave is in proportion to the acoustic velocity of the surface acoustic wave and is in inverse proportion to the wavelength of the surface acoustic wave. This means that a slow acoustic velocity of a surface acoustic wave causes the frequency of the surface acoustic wave to decrease. The frequency can be increased by shortening the wavelength. However, the wavelength of a surface acoustic wave excited on a surface of a piezoelectric material depends on the pitch of an interdigitai transducer (IDT) formed on the surface, and a resolution at which the interdigitai transducer is formed is limited. Therefore, the frequency of a surface acoustic wave that can be used in a surface acoustic wave device has an upper limit that varies depending on what piezoelectric material is used.

This indicates that a surface acoustic wave device has an upper limit to its pass band when used as a filter. This also indicates that when a surface acoustic wave device is used as a wireless sensor, the frequency of the device's surface acoustic wave is also the frequency of electromaqnetic communication used for remote measurement, and hence a large antenna is needed for transmission and reception when the frequency is low. As a result, it is not possible to obtain a small-sized surface acoustic wave sensor that is easy to handle. In actuality, a surface acoustic wave device that uses langasite or langatate as described above cannot use a 2 GHz to 2.5 GHz band or higher, and therefore is limited in its use as a filter, which leads to a difficulty in producing a wireless sensor of a practical size. Further, it is not easy to steadily supply langasite and langatate because constituent elements of langasite and langatate include lanthanum, gallium, and tantalum, which are rare elements called rare metals or rare earth elements.

Hitherto, no known piezoelectric material that is said to be usable for surface acoustic wave devices, has both high-temperature resistance reaching 1,000° C. and an acoustic velocity high enough to enable use of a 2 GHz to 2.5 GHz band or higher.

The present invention has been made in view of the circumstances described above, and has an object to provide a surface acoustic wave device using a novel and steadily suppliable piezoelectric material that is resistant to a high-temperature environment and enables the surface acoustic wave device to use a 2 GHz to 2.5 GHz band or higher.

Solution to Problem

The invention disclosed herein in order to attain the object described above has various aspects, and exemplary aspects are summarized as follows:

(1) A surface acoustic wave device includes: a piezoelectric substrate formed from a monocrystal of gehlenite (CAS: Ca2Al(AlSi)O7); and an interdigital transducer formed on a surface acoustic wave propagation plane of the piezoelectric substrate.

(2) In the surface acoustic wave device according to Item (1), the surface acoustic wave propagation plane is a plane that is obtained by rotating a (001) plane by an angle θ with respect to a [110] orientation, a surface acoustic wave traveling direction is the [110] orientation, and the angle θ satisfies 0°≤θ≤80°.

(3) In the surface acoustic wave device according to Item (1), the surface acoustic wave propagation plane is a plane that is obtained by rotating a (001) plane by an angle θ with respect to a [110] orientation, a surface acoustic wave traveling direction is the [110] orientation, and the angle θ satisfies 60°≤θ≤90°.

(4) In the surface acoustic wave device according to Item (1), the surface acoustic wave propagation plane is a plane that is obtained by rotating a (001) plane by an angle θ with respect to a [100] orientation, a surface acoustic wave traveling direction is the [100] orientation, and the angle θ satisfies 40°≤θ≤75°.

(5) In the surface acoustic wave device according to Item (1), the surface acoustic wave propagation plane is a plane that is obtained by rotating a (001) plane by an angle θ with respect to a [100] orientation, a surface acoustic wave traveling direction is the [100] orientation, and the angle θ satisfies 45°≤θ≤80°.

(6) In the surface acoustic wave device according to Item (1), the surface acoustic wave propagation plane is a plane that is obtained by rotating a (100) plane by an angle θ with respect to a [001] orientation, a surface acoustic wave traveling direction is the [001] orientation, and the angle θ satisfies 20°≤θ≤70°.

(7) In the surface acoustic wave device according to Item (1), the surface acoustic wave propagation plane is a (001) plane.

(8) In the surface acoustic wave device according to Item (1), the surface acoustic wave propagation plane is a 45° Y plane, and a surface acoustic wave traveling direction is in a range of from to −45° to 45° with a 45° direction set as 0°.

(9) In the surface acoustic wave device according to Item (1), a surface acoustic wave traveling direction is a direction indicated by a propagation angle at which an acoustic velocity takes an extremal value in relation to the propagation angle in the surface acoustic wave propagation plane, or by an angle close to the propagation angle.

(10) In the surface acoustic wave device according to Item (9), the surface acoustic wave propagation plane is a (111) plane, and the surface acoustic wave traveling direction is in a range of from −5° to 5° or a range of from 85° to 95° with a [110] orientation set to 0°.

(11) In the surface acoustic wave device according to any one of Items (1) to (10), the surface acoustic wave device is a sensor.

(12) The surface acoustic wave device according to Item (11) further includes an antenna connected to the interdigital transducer, in which the antenna enables the surface acoustic wave device to perform wireless remote sensing.

(13) The surface acoustic wave device according to Item (11) further includes a terminal connected to the interdigitai transducer, and the terminal enables the surface acoustic wave device to perform wired sensing.

(14) In the surface acoustic wave device according to any one of Items (1) to (10) the surface acoustic wave device is a filter.

Advantageous Effects of Invention

According to the various aspects of the invention disclosed herein, it is possible to provide the surface acoustic wave device using a novel and steadily suppliable piezoelectric material that is resistant to a high-temperature environment and enables the surface acoustic wave device to use a 2 GHz to 2.5 GHz band or higher.

DESCRIPTION OF EMBODIMENTS

A first embodiment of the present invention is described below with reference to FIG. 1 to FIG. 17.

Figure 1:
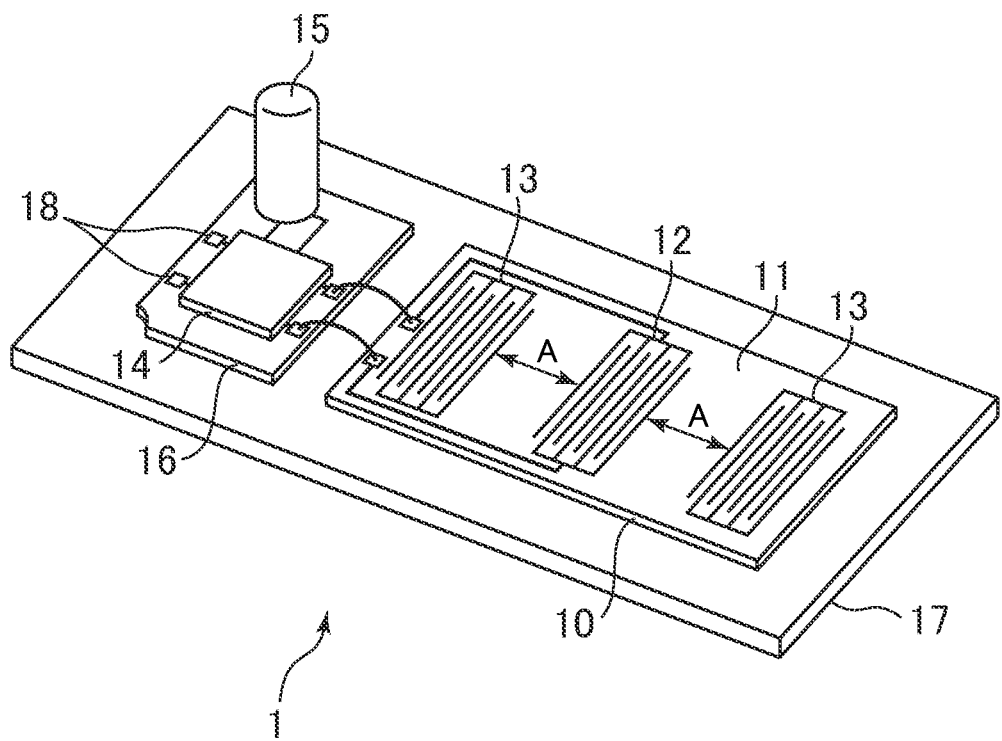
FIG. 1 is a perspective view of the exterior of a wireless temperature sensor, which is a surface acoustic wave device according to a first embodiment of the present invention.

FIG. 1 is a perspective view of the exterior of a wireless temperature sensor 1, which is a surface acoustic wave device according to the first embodiment of the present invention. The wireless temperature sensor 1 includes a piezoelectric substrate 10, which is cut so as to have a flat board shape, an excitation electrode 12, which is an interdigital transducer formed on a surface acoustic wave propagation plane 11, and a pair of reflective electrodes 13, which are also interdigital transducers formed so as to sandwich the excitation electrode 12. The surface acoustic wave propagation plane 11 is one surface of the piezoelectric substrate 10 on which a surface acoustic wave is excited and propagated.

The excitation electrode 12 is connected to an antenna 15 via a matching circuit 14. The reflective electrodes 13, on the other hand, are floating electrodes in the first embodiment. In the first embodiment, electromagnetic waves transmitted and received by the antenna 15 are in a frequency band that is an ultra-high frequency range and, for example, are assumed to have a frequency of 2.45 GHz. The matching circuit 14 is a circuit configured to match the transmission side and the reception side electrically, in other words, to perform impedance matching, when energy is exchanged with the excitation electrode 12 through the use of an electromagnetic wave having a frequency of 2.45 GHz.

The matching circuit 14 and the antenna 15 are mounted on a mount substrate 16, which is mounted on a base substrate 17. The piezoelectric substrate 10 and the mount substrate 16 are electrically connected to each other by a suitable method, for example, wire bonding. Terminals 18 are further provided on the mount substrate 16. The terminals 18 are connected directly, or via the matching circuit 14, to the excitation electrode 12.

The matching circuit 14 illustrated here is an integrated chip part. Alternatively, the matching circuit 14 may include inductors and capacitors that are mounted individually, or that are made by a wiring pattern formed on the mount substrate 16. The antenna 15 illustrated here is a helical monopole antenna, which is easy to downsize. However, an arbitrary antenna form suitable for the frequency band to be used can be employed and, similarly to the matching circuit 14, the antenna 15 may be made by a wiring pattern formed on the mount substrate 16.

Instead of preparing the piezoelectric substrate 10 and the mount substrate 16 separately, the matching circuit 14 and the antenna 15 may be provided directly on the piezoelectric substrate 10. The base substrate 17 may be omitted in this case.

When an electromagnetic wave having a given frequency (here, 2.45 GHz as mentioned above) is transmitted to the wireless temperature sensor 1, a surface acoustic wave that travels in a direction indicated by an arrow A in FIG. 1 is excited on the piezoelectric substrate 10 by electric power input to the excitation electrode 12 from the antenna 15. The traveling direction of the surface acoustic wave is orthogonal to comb-teeth portions of the interdigital transducers. The surface acoustic wave is reflected by the reflective electrodes 13. This generates a standing wave on the piezoelectric substrate 10, and energy is accumulated as a result.

When the transmission of the electromagnetic wave is stopped subsequently, the wireless temperature sensor 1 emits from the antenna 15 an electromagnetic wave at a frequency equal to the resonance frequency, while consuming the accumulated energy as a surface acoustic wave. The resonance frequency of the wireless temperature sensor 1 can be known by receiving the emitted electromagnetic wave. Knowing the resonance frequency leads to finding out the acoustic velocity of the piezoelectric substrate 10 and therefore the temperature of the piezoelectric substrate 10, because the acoustic velocity of the piezoelectric substrate 10 is dependent on temperature.

A monocrystal of gehlenite (CAS: Ca2Al(AlSi)O7) is used as the piezoelectric substrate 10 in the first embodiment. The piezoelectric substrate 10 is obtained by creating a monocrystal line ingot of gehlenite by, for example, the Czochralski method, and cutting the ingot at an appropriate angle that gives a desired surface acoustic wave propagation plane 11.

A gehlenite monocrystal exhibits stable piezoelectric characteristics until about 1,200° C., and withstands high temperature satisfactorily. A gehlenite monocrystal is also generally high in the acoustic velocity of its surface acoustic wave at from 3,500 m/s to 4,100 m/s, although the value varies depending on the cut plane of the monocrystal as described later. Gehlenite can therefore enable use of a high frequency range of from 2 GHz to 2.5 GHz or higher through the use of an interdigital transducer having a half-wave length of 365 nm, which is a resolution obtained when a general stepper, for example, an i-line stepper, is employed.

In addition, gehlenite has calcium, aluminum, silicon, and oxygen as its constituent elements and is made up solely of very common elements, which enables gehlenite to be supplied steadily and inexpensively.

The temperature measuring method described above can be carried out in a similar manner when measurement equipment is directly connected to the terminals 18 by a cable. This is because the resonance frequency of the wireless temperature sensor 1 can be known by applying an alternating voltage that has a given frequency to the wireless temperature sensor 1 through the terminals 18, subsequently stopping the application of the alternating voltage, and then measuring the frequency of an alternating voltage that is output from the terminals 18. The wireless temperature sensor 1 illustrated in FIG. 1 is provided with both the antenna 15 and the terminals 18 in order to enable the wireless temperature sensor 1 to perform both wireless remote sensing and wired sensing. In a case where the wireless temperature sensor 1 can perform only wireless remote sensing, the terminals 18 are unnecessary and can be omitted. In a case where the wireless temperature sensor 1 can perform only wired sensing, the antenna 15, and in some cases the matching circuit 14, can be omitted.

The acoustic velocity and the degree of loss on the surface acoustic wave propagation plane 11 of the piezoelectric substrate 10 depend on the orientation of the surface acoustic wave propagation plane 11 and the surface acoustic wave propagation direction. It is therefore necessary to take into account the crystal orientation of gehlenite when determining the acoustic velocity and the degree of loss.

Figure 2:
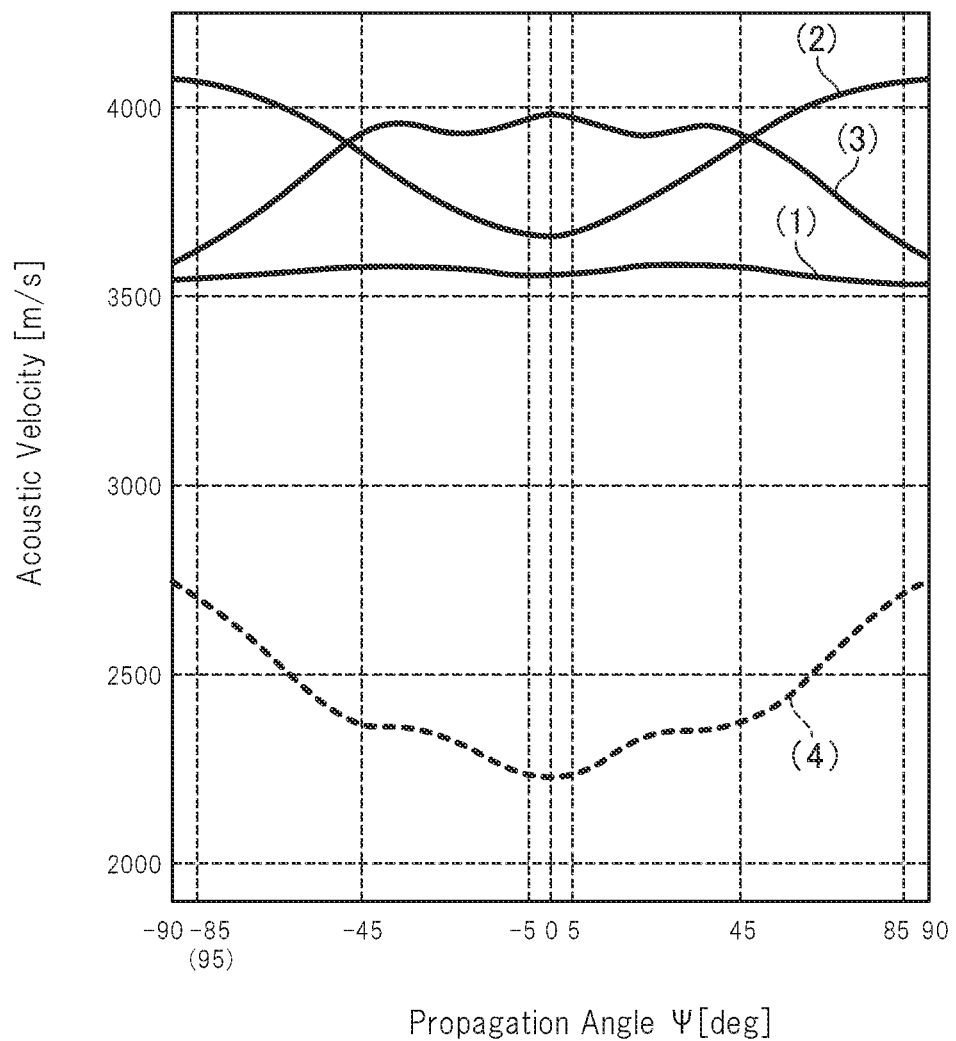
FIG. 2 is a graph for showing the result of measuring an acoustic velocity on a particular cut plane of a monocrystal of gehlenite, in relation to a propagation angle (a direction in the cut plane).

FIG. 2 is a graph for showing the result of measuring the acoustic velocity on a particular cat plane of a monocrystal of gehlenite, in relation to a propagation angle ψ (a direction in the cut plane). In the graph, the axis of ordinate represents the acoustic velocity and the axis of abscissa represents the propagation angle. The cut plane shown here corresponds to the surface acoustic wave propagation plane 11, and the propagation angle ψ of the acoustic velocity corresponds to the surface acoustic wave propagation direction. The acoustic velocity shown in the graph is the result of measuring a leaky surface acoustic wave.

Figure 3:
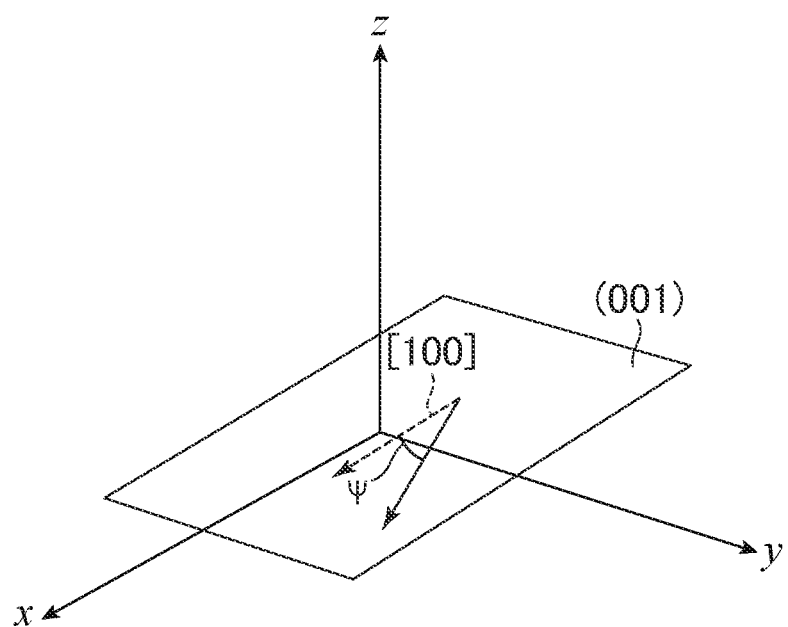
FIG. 3 is a diagram for illustrating a propagation angle ψ that is observed when gehlenite is cut on a (001) plane.

A curve (1) in the graph represents a result obtained when gehlenite is cut on a (001) plane. The propagation angle ψ in this case indicates, as illustrated in FIG. 3, an orientation measured with a [100] orientation as 0° and the counter-clockwise direction in the cut plane as a positive direction. In descriptions given herein, crystal axes denoted by X, Y, and Z are in a right-hand system, and a positive rotation direction is the direction of a right-hand screw. Referring back to FIG. 2, the acoustic velocity in this case is roughly within a range of from 3,500 m/s to 3,600 m/s, has substantially no propagation angle dependence, and is generally at a constant value, as can be seen in the graph. This indicates that using the (001) plane as the surface acoustic wave propagation plane 11 yields a generally constant acoustic velocity without paying much consideration to the surface acoustic wave propagation direction. This means that the in-plane crystal orientation does not need to be considered when the interdigital transducers are created in the manufacture of the piezoelectric substrate 10, thereby making the manufacture very easy.

Figure 4:
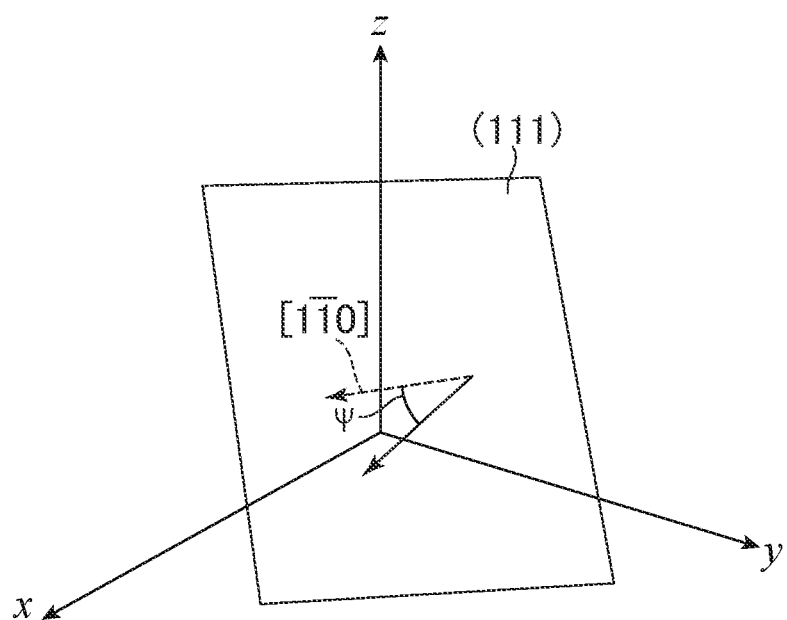
FIG. 4 is a diagram for illustrating the propagation angle ψ that is observed when gehlenite is cut on a (111) plane.

A curve (2) in the graph represents a result obtained when gehlenite is cut on a (111) plane. The propagation angle ψ in this case indicates, as illustrated in FIG. 4, an orientation measured with a [110] orientation as 0° and the counterclockwise direction in the cut plane as a positive direction. The acoustic velocity takes a local minimum value when the propagation angle ψ is 0° and takes a local maximum value when the propagation angle ψ is 90°, and the value of the acoustic velocity is generally distributed in a range of from 3,700 m/s to 4,100 m/s, as can be seen in the graph. The surface acoustic wave propagation direction in this case is desirably a direction indicated by the propagation angle at which the acoustic velocity takes the local minimum value, or by an angle close to this propagation angle.

The reason for this is that, in a region where the acoustic velocity changes in relation to the propagation angle ψ (where the slope is not 0 in the graph of FIG. 2), the surface acoustic wave is dissipated among directions in which the acoustic velocity is slower, thereby increasing the loss. In a region where the acoustic velocity takes an extremal value, i.e., where the acoustic velocity does not change in relation to the propagation angle ψ (the slope is 0 in the graph of FIG. 2), or changes little, the straightness of the travel of the surface acoustic wave is high and the loss is kept small. The loss is particularly small in area region where the acoustic velocity takes a local minimum value, i.e., where the change of the acoustic velocity in relation to the propagation angle ψ shifts from a decrease to an increase (a region where the slope changes from negative to positive in the graph of FIG. 2), because the surface acoustic wave concentrates on the propagation angle ψ at which the acoustic velocity takes a local minimum value in this region. When the (111) plane represented by the curve (2) is used as the surface acoustic wave propagation plane 11, the recommended surface acoustic wave propagation direction is a direction indicated by the propagation angle ψ that is 0°, 90°, or an angle close to 0° or 90°. More specifically, the recommended surface acoustic wave propagation direction is set within a range of from −5° to 5°, or a range of from 85° to 90°, with the propagation angle ψ of the [110] orientation as 0°. Which one of the ranges is to be selected can be determined based on a frequency band to be used while taking the acoustic velocity into account.

A curve (3) in the graph represents a result obtained when gehlenite is cut on a plane that is obtained by rotating a (010) plane counterclockwise by 45° with respect to the X-axis (hereinafter this plane is referred to as "45° Y plane"). The 45° Y plane does not strictly match with a (011) plane because the unit cell of gehlenite is not cubic. In this case, the propagation angle ψ is 0° in a direction obtained by rotating the Z-axis (the [001] orientation) by 45° with respect to the X-axis (this direction is hereinafter referred to as "45° Z direction"), and the counterclockwise direction is set as a positive direction. The 45° Z direction also does not strictly match with a [0$\bar{1}$1] orientation for the same reason. The rotation direction with respect to the X-axis is the direction of a right-hand screw relative to the X-axis.

Figure 5:
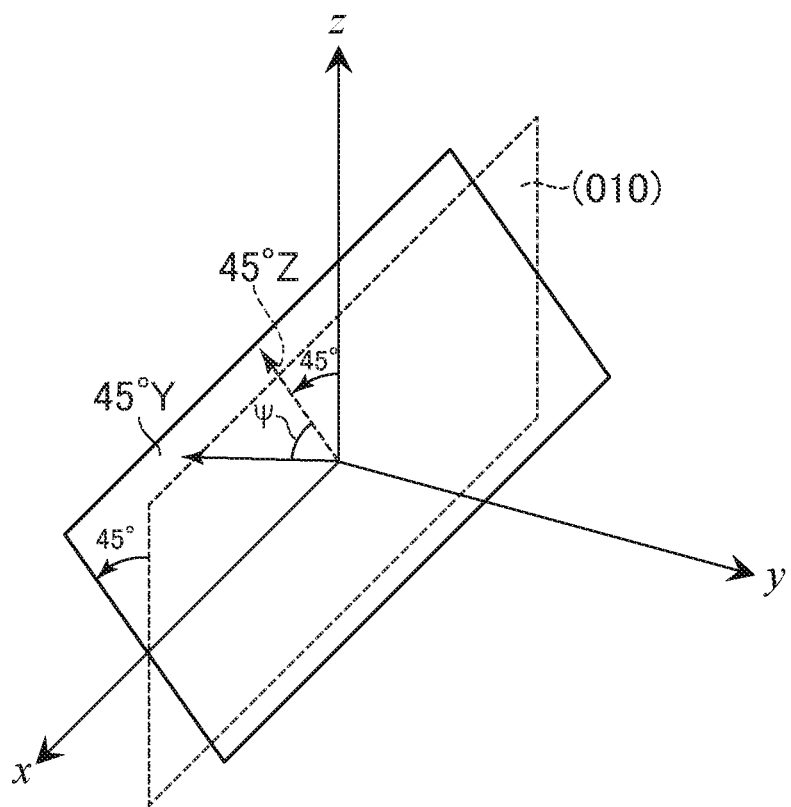
FIG. 5 is a diagram for illustrating a 45° Y plane.

To facilitate understanding of the description, the 45° Y plane is illustrated in FIG. 5. The 45° Y plane is a plane obtained by rotating the (010) plane that is illustrated in FIG. 5 about the X-axis by 45° in the illustrated direction. The 45° Z direction is a direction obtained by rotating the Z-axis about the X-axis in a Y-Z plane by 45° in the illustrated direction. The propagation angle ψ indicates, as illustrated in FIG. 5, a direction in the cut plane that is measured when the counterclockwise direction with respect to the 45° Z direction is a positive direction.

Referring back to FIG. 2, the acoustic velocity in the case of FIG. 2 takes a local maximum value when the propagation angle ψ is 0°, and is distributed generally in a range of from 3,600 m/s to 4,000 m/s, as can be seen in the graph. The acoustic velocity does not change much when the propagation angle ψ is in a range of from −45° to 45°, and is substantially at the maximum value throughout this range. This means that, when the 45° Y plane is used as the surface acoustic wave propagation plane 11, a substantially constant acoustic velocity can be obtained in a wide range without strictly setting the surface acoustic wave propagation direction, and that the loss of the acoustic velocity is small. Accordingly, the in-plane crystal orientation does not need to be considered strictly, and an angle misalignment is tolerated to some extent when the interdigital transducers are created in the manufacture of the piezoelectric substrate 10. Therefore, the piezoelectric substrate 10 is easily manufactured in this case as well.

A curve (4) in the graph represents a result obtained for comparison when langatate is cut on the (010) plane, the propagation angle ψ is 0° in the [100] orientation, and the counterclockwise direction is set as a positive direction. It can be seen in the graph that the acoustic velocity in this case is generally a low value between 2,250 m/s and 2,750 m/s.

As in the description given above, when a particular plane or a particular direction in a crystal is mentioned explicitly herein, not only a plane or a direction that is theoretically a strict match with the particular plane or direction but also a range of planes or directions that can practically be deemed as identical to the particular plane or direction are included. Specifically, when a description mentions a particular crystal plane, for example, the (001) plane, the description is to be considered as including a theoretically identified crystal plane (in this case, the (001) plane) and a range of planes that are deemed as practically the same as or close to the theoretically identified plane in physical properties. The same applies to directions, and a description that mentions a particular direction is to be considered as including a theoretically identified direction and a range of directions that are deemed as practically the same as or close to the theoretically identified direction in physical properties. More specifically, when a particular plane is mentioned, planes having a normal line within ±10°, preferably ±5°, more preferably ±2.5° with respect to the theoretically identified plane are included. When a particular direction is mentioned, directions that are within ±10°, preferably ±5°, more preferably ±2.5°, with respect to the theoretically identified direction are included.

A further description is given below with reference to FIG. 6 to FIG. 14 on a cut plane of gehlenite and a surface acoustic wave propagation direction that are suitable for a surface acoustic wave device.

Figure 6:
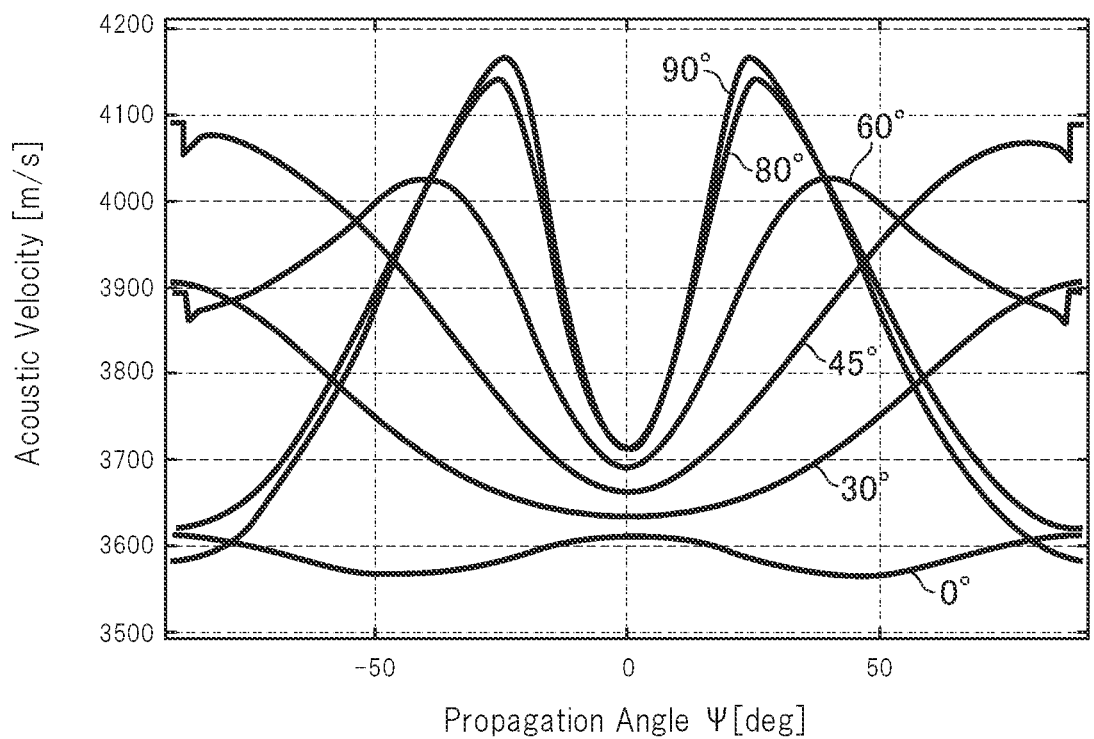
FIG. 6 is a graph for showing a relationship between the propagation angle and the acoustic velocity that is observed when gehlenite is cut on a [110] propagation θ rotation Z plane and a [110] orientation is set as a propagation angle of 0°.

FIG. 6 is a graph for showing a relationship between the propagation angle ψ and the acoustic velocity that is observed when gehlenite is cut on a plane that is obtained by rotating the (001) plane counterclockwise by an angle θ with respect to the [110] orientation (this plane is hereinafter referred to as "[110]propagation θ rotation Z plane"), and the propagation angle ψ in the [110] orientation is set to 0°.

Changes that the acoustic velocity undergoes in relation to the propagation angle ψ when θ is set to 0°, 30°, 45°, 60°, 80°, and 90° are shown in FIG. 6.

Figure 7:
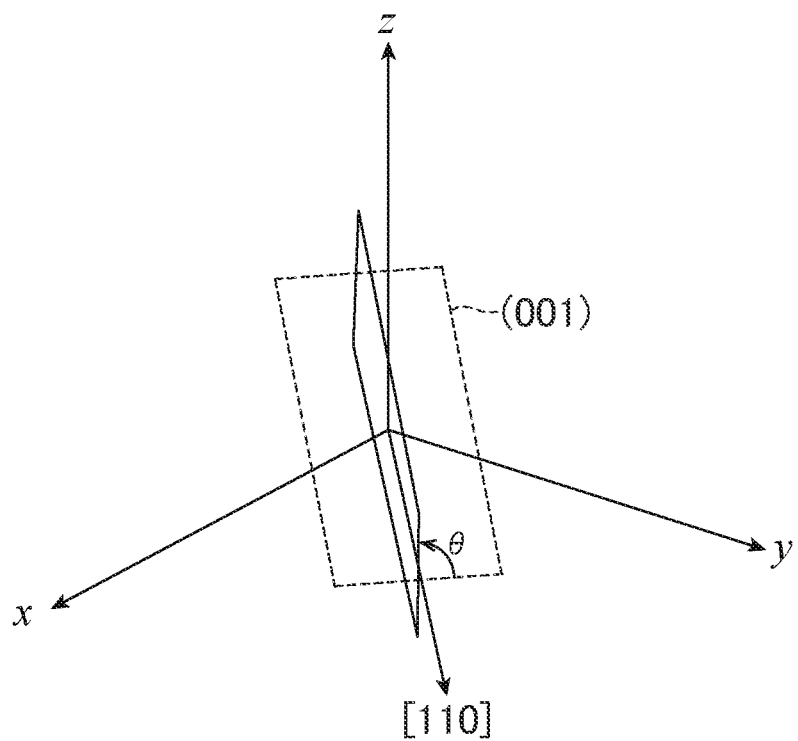
FIG. 7 is a diagram for illustrating the [110] propagation θ rotation Z plane.
Figure 8:
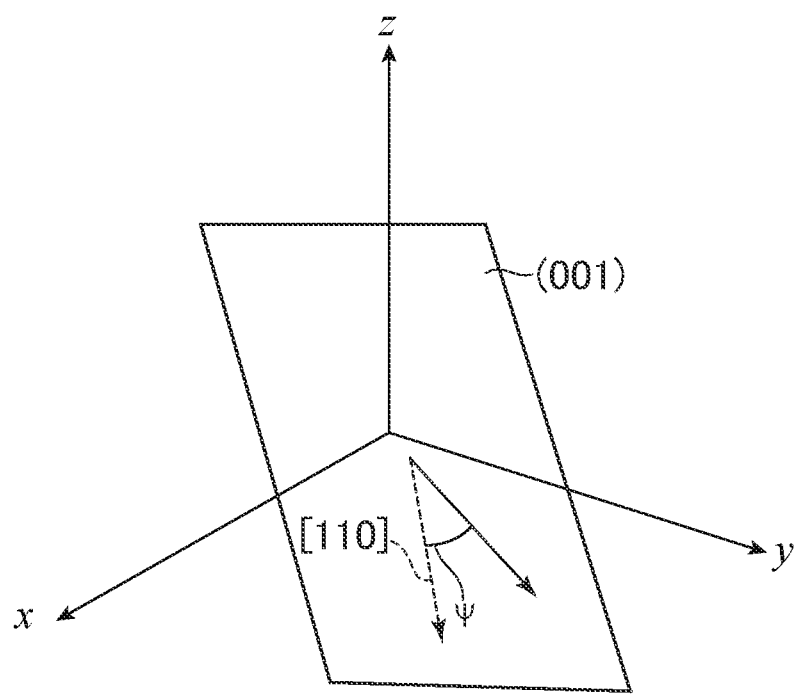
FIG. 8 is a diagram for illustrating the propagation angle ψ that is observed when gehlenite is cut on the [110] propagation θ rotation Z plane.

FIG. 7 is a diagram for illustrating the [110] propagation θ rotation Z plane. The [110] propagation θ rotation Z plane is a plane that is represented by the solid line in FIG. 7 and that is obtained by rotating the (001) plane, which is represented by the broken line, counterclockwise by θ with respect to the [110] orientation as illustrated in FIG. 7. This plane is equal to the (001) plane when θ is 0°. This plane is the (1$\bar{1}$0) plane when θ is 90°. The propagation angle ψ is 0° in the [110] orientation as illustrated in FIG. 8, and the counterclockwise direction in the cut plane is a positive direction (in FIG. 8, the (001) plane is illustrated as the cut plane).

Referring back to FIG. 6, the graph clearly shows that, when the [110] propagation θ rotation Z plane is used as the surface acoustic wave propagation plane 11, the acoustic velocity takes an extremal value at a propagation angle ψ of 0° irrespective of the value of θ. It is also understood that the acoustic velocity takes a local minimum value at a propagation angle ψ of 0° when θ is at least equal to or more than 30°, except when θ is small, for example, when θ is close to 0°.

The acoustic velocity is lost little at a propagation angle that gives the acoustic velocity a local minimum value, as already described. When the curvature at the local minimum value is higher (appears in the graph as a narrower and steeper concave), the surface acoustic wave concentrates more on the propagation angle ψ at which the acoustic velocity takes the local minimum value, which is favorable in terms of loss. It can therefore be said from the viewpoint of loss that θ closer to 90° is better when the propagation angle ψ is set to 0°. In addition, the acoustic velocity is generally from 3,610 m/s to 3,710 m/s, which is higher than in the case of langatate represented by the curve (4) of FIG. 2.

Figure 9:
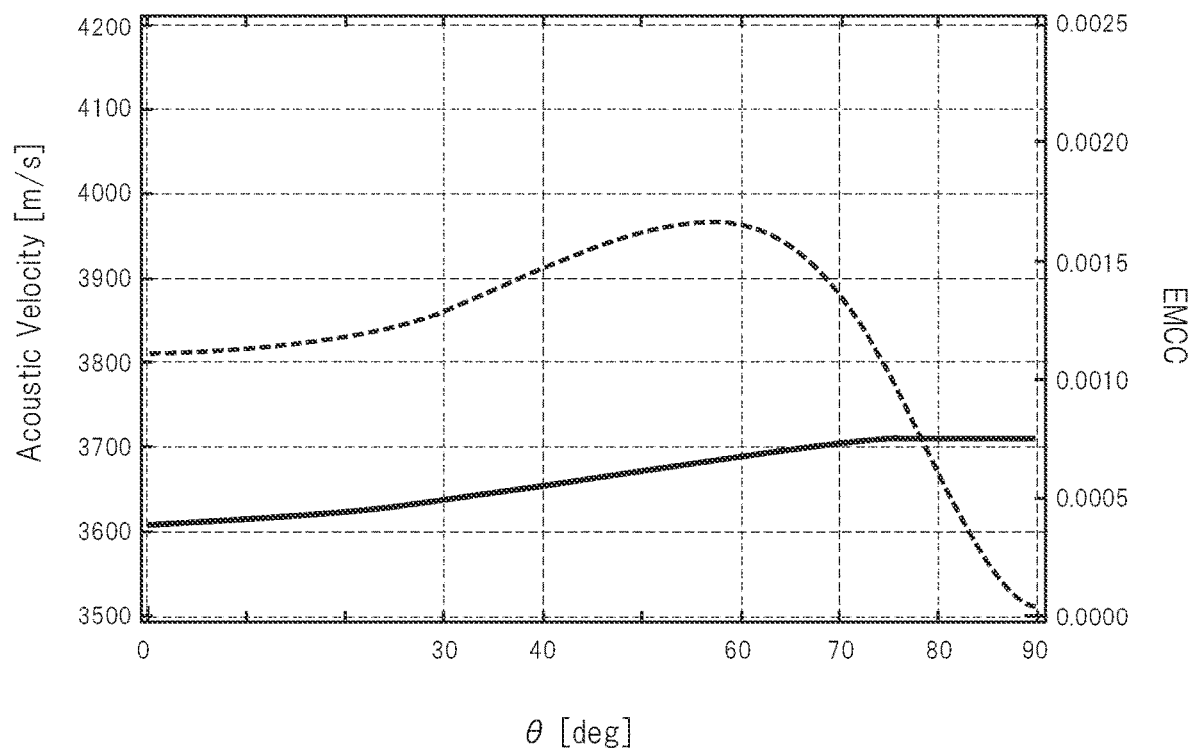
FIG. 9 is a graph for showing a relationship between θ and the acoustic velocity and a relationship between θ and an electromechanical coupling coefficient that are observed on the [110] propagation θ rotation Z plane when the propagation angle is set to 0°.

However, adequacy as a surface acoustic wave device cannot be determined by the magnitude of the acoustic velocity and the magnitude of loss alone. FIG. 9 is a graph for showing a relationship between θ and the acoustic velocity and a relationship between θ and an electromechanical coupling coefficient (EMCC) that are observed on the [110] propagation θ rotation Z plane when the propagation angle ψ is set to 0°. In the graph, the acoustic velocity is represented by the solid line and the electromechanical coupling coefficient is represented by the broken line.

The electromechanical coupling coefficient is a ratio of elastic strain energy accumulated in a piezoelectric body to electric energy that is input when a vibration strain is caused by applying an alternating voltage to the piezoelectric body, and serves as an index that indicates more efficient conversion from electric energy to elastic strain energy by taking a larger value. As shown in FIG. 9, the electromechanical coupling coefficient on the [110] propagation θ rotation Z plane increases as θ increases from 0°, reaches a maximum value when θ is slightly less than 60°, and then rapidly drops as θ approaches 90°.

Since a high electromechanical coupling coefficient promotes the conversion of input electric energy into elastic strain energy, it is important to make the electromechanical coupling coefficient high in types of surface acoustic wave devices that are demanded to have quick response. Surface acoustic wave devices of this type are, for example, band pass filters and sensors that have a high sampling rate. On the other hand, in sensors that use a standing wave generated by resonance and do not have a high sampling rate, for example, temperature sensors, the electromechanical coupling coefficient is not so important and is more advantageous when having a small loss. Adequacy as a surface acoustic wave device is therefore determined by taking the acoustic velocity and the loss, and the electromechanical coupling coefficient, into account In the case where the [110] propagation θ rotation Z plane described here is used for a surface acoustic wave device that, is demanded to have quick response, the magnitude of the electromechanical coupling coefficient is more important than the loss, which results in a desirable range of θ around 0°≤θ≤80°. Selecting a plane that further narrows down the range of θ to θ≥30° is recommended when a propagation angle at which the acoustic velocity takes a local minimum value is selected. A range of θ that works well in balancing the magnitude of the acoustic velocity and the magnitude of the electromechanical coupling coefficient is 40°≤θ≤70°.

On the other hand, in the case where the [110] propagation θ rotation Z plane is used for a surface acoustic wave device that uses a standing wave generated by resonance and is not demanded to have quick response, keeping the loss small is more important than making the electromechanical coupling coefficient high. A recommended range of θ is therefore 60°≤θ≤90°, where the curvature at the local minimum value is high in the graph of FIG. 6. A range of θ that works well in making the electromechanical coupling coefficient not so low and keeping the loss small is around 80°.

Figure 10:
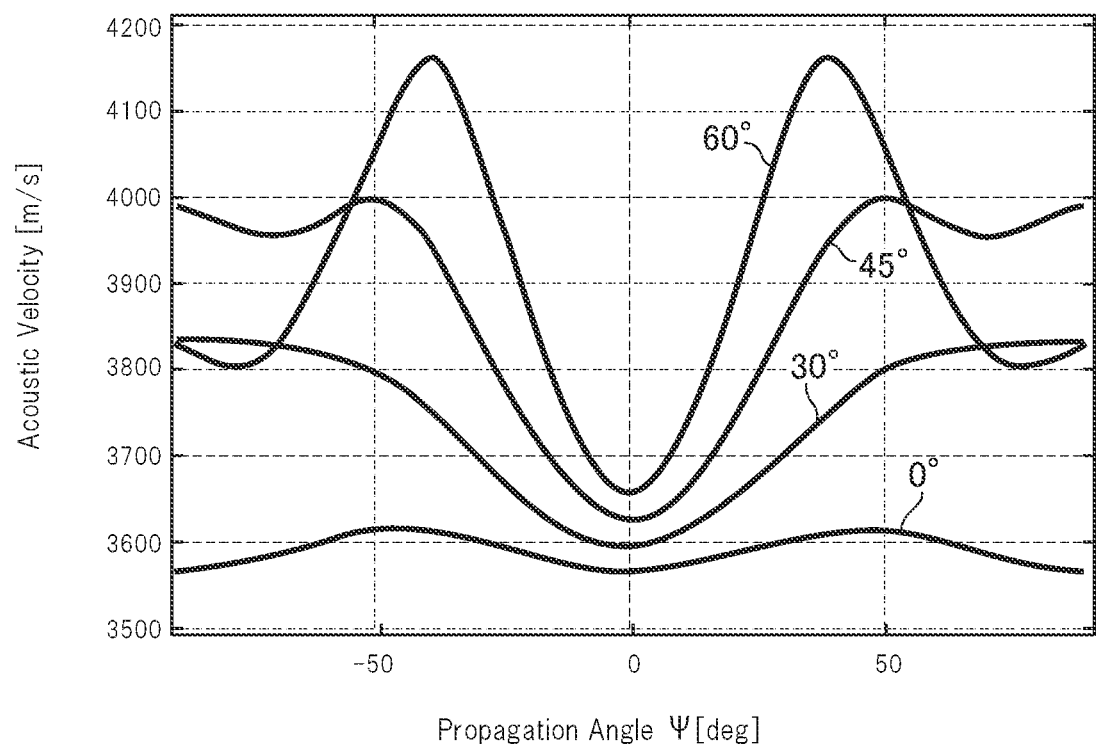
FIG. 10 is a graph for showing a relationship between the propagation angle and the acoustic velocity that is observed when gehlenite is cut on a [100] propagation θ rotation Z plane and a [100] orientation is set as a propagation angle of 0°.

FIG. 10 is a graph for showing a relationship between the propagation angle ψ and the acoustic velocity that is observed when gehlenite is cut on a plane that is obtained by rotating the (001) plane counterclockwise by the angle θ with respect to the [100] orientation (this plane is hereinafter referred to as "[100] propagation θ rotation Z plane"), and the propagation angle ψ in the [100] orientation is set to 0°. Changes that the acoustic velocity undergoes in relation to the propagation angle ψ when θ is set to 0°, 30°, 45°, and 60° are shown in FIG. 10.

Figure 11:
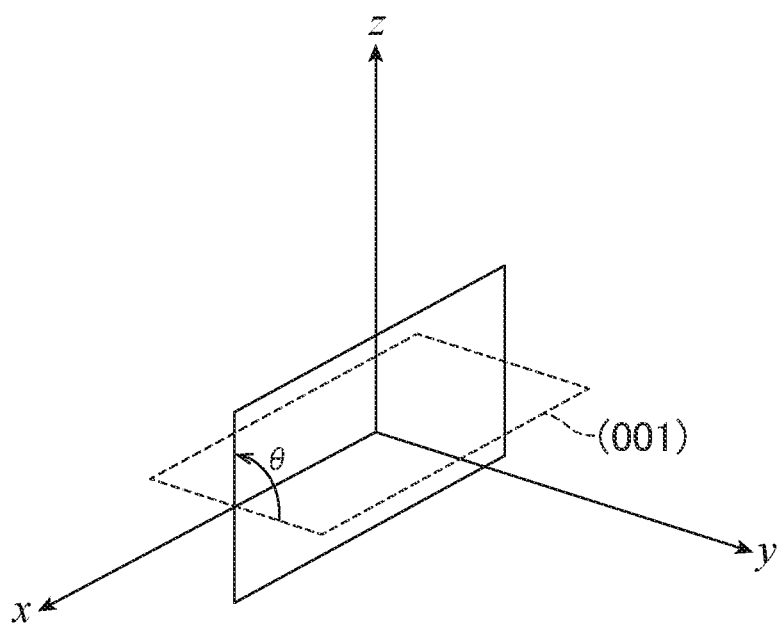
FIG. 11 is a diagram for illustrating the [100] propagation θ rotation Z plane.
Figure 12:
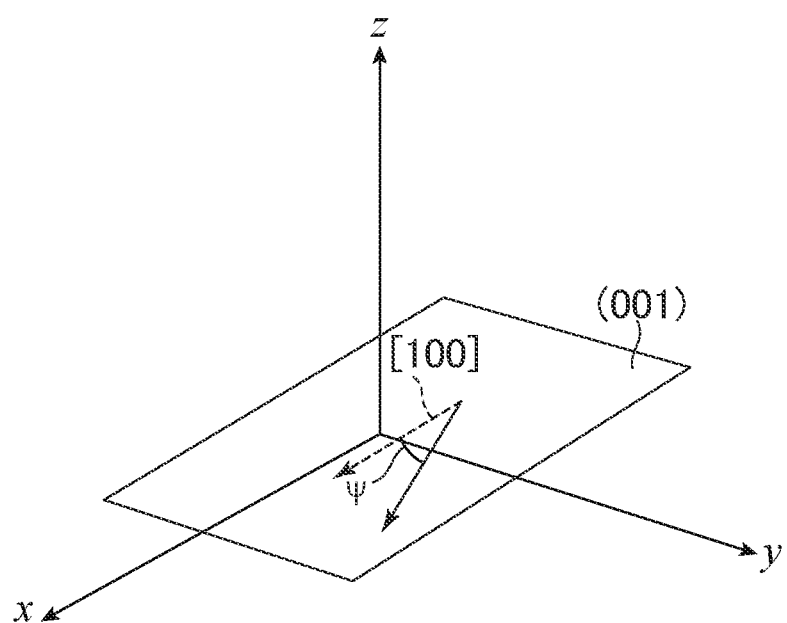
FIG. 12 is a diagram for illustrating the propagation angle ψ that is observed when gehlenite is cut on the [100] propagation θ rotation Z plane.

FIG. 11 is a diagram for illustrating the [100] propagation θ rotation Z plane. The [100] propagation θ rotation Z plane is a plane that is represented by the solid line in FIG. 11 and that is obtained by rotating the (001) plane, which is represented by the broken line, counterclockwise by θ with respect to the [100] orientation as illustrated in FIG. 11. This plane is equal to the (001) plane when θ is 0°. This plane symmetrically matches with the 45° Y plane described above when θ is 45°. The propagation angle ψ is 0° in the [100] orientation as illustrated in FIG. 12, and the counterclockwise direction in the cut. plane is a positive direction (in FIG. 12, the (001) plane is illustrated as the cut plane).

Referring back to FIG. 10, the graph clearly shows that, when the [100] propagation θ rotation Z plane is used as the surface acoustic wave propagation plane 11, the acoustic velocity takes a local minimum value at a propagation angle ψ of 0° irrespective of the value of θ.

Figure 13:
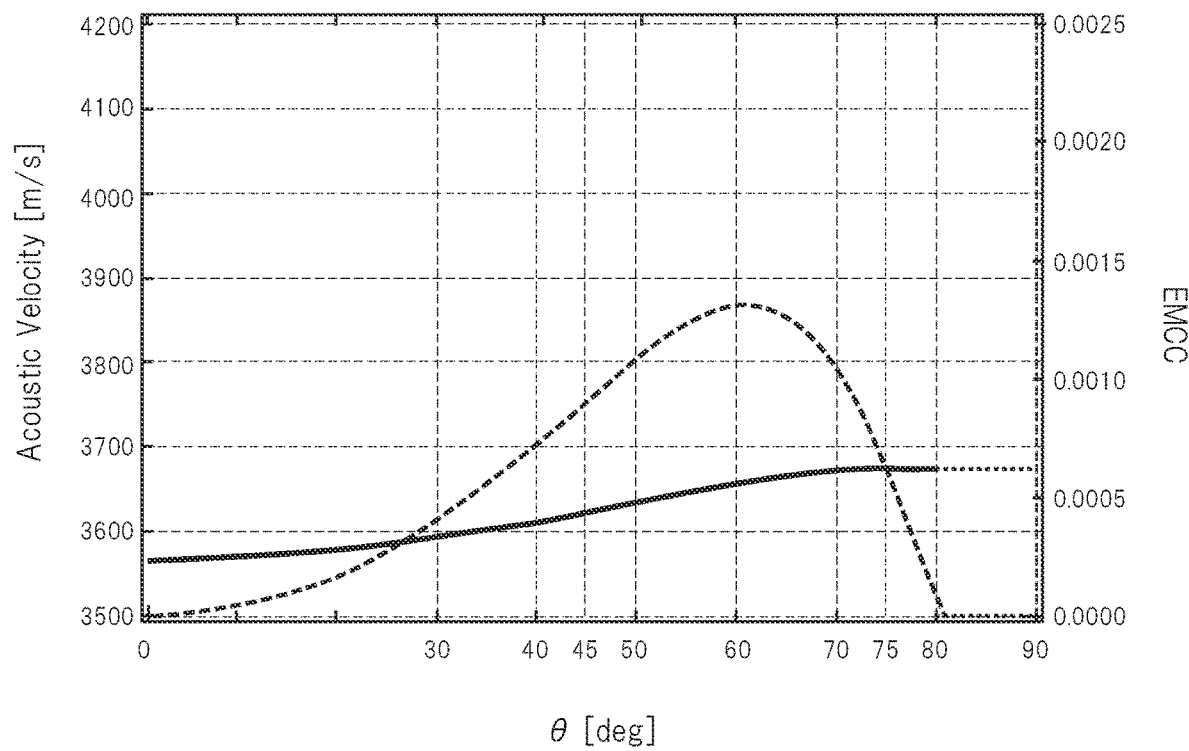
FIG. 13 is a graph for showing a relationship between θ and the acoustic velocity and a relationship between θ and the electromechanical coupling coefficient that are observed on the [100] propagation θ rotation Z plane when the propagation angle is set to 0°.

FIG. 13 is a graph for showing a relationship between θ and the acoustic velocity and a relationship between θ and the electromechanical coupling coefficient that are observed on the [100] propagation θ rotation Z plane when the propagation angle is set to 0°. As shown in FIG. 13, the electromechanical coupling coefficient on the [100] propagation θ rotation Z plane increases as θ increases from 0°, reaches a maximum value when θ is around 60°, rapidly drops as θ approaches 90°, and becomes substantially 0 when θ is around 80°.

Accordingly, in the case where the [100] propagation θ rotation Z plane described here is used for a surface acoustic wave device that is demanded to have quick response, the range of θ is desirably 40°≤θ≤70°, more desirably 50°≤θ≤70°.

On the other hand, in the case where the [100] propagation θ rotation Z plane is used for a surface acoustic wave device that uses a standing wave generated by resonance and is not demanded to have quick response, the range of θ to be selected is generally θ≥45°. However, a range of θ that makes the electromechanical coupling coefficient substantially 0 is not appropriate, and a recommended range is therefore 45°≤θ≤80°.

Figure 14:
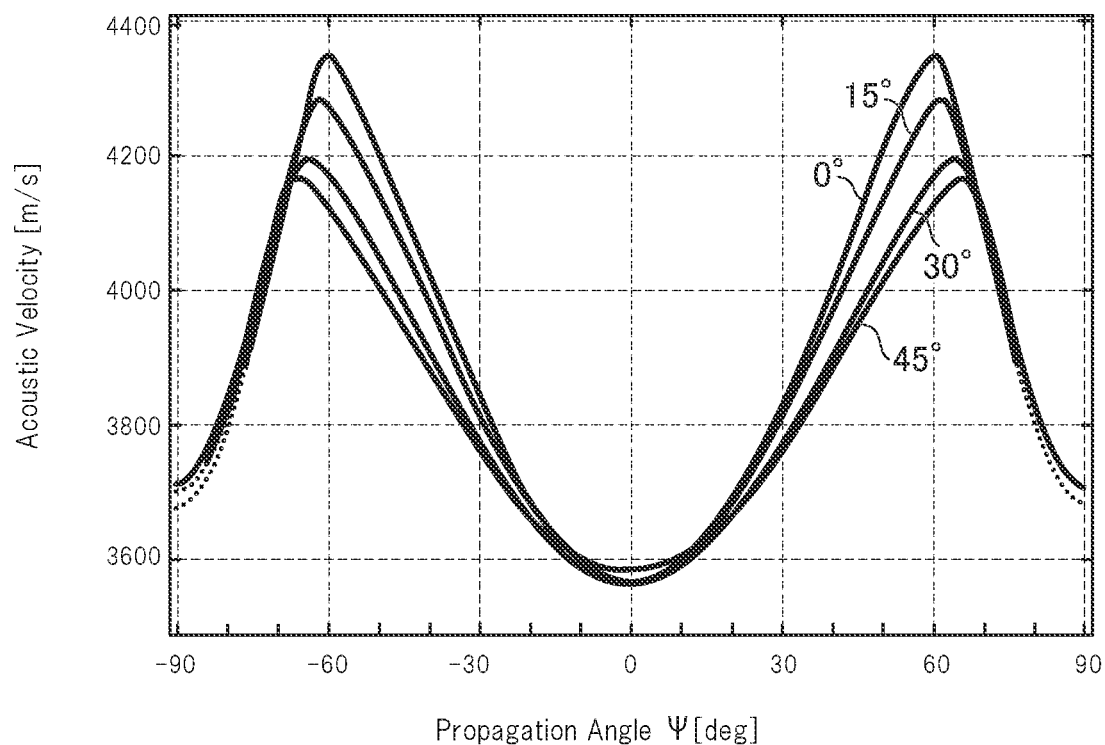
FIG. 14 is a graph for showing a relationship between the propagation angle and the acoustic velocity that is observed when gehlenite is cut on a [001] propagation θ rotation X plane and a [001] orientation is set as a propagation angle of 0°.

FIG. 14 is a graph for showing a relationship between the propagation angle ψ and the acoustic velocity that is observed when gehlenite is cut on a plane that is obtained by rotating the (100) plane counterclockwise by the angle θ with respect to the [001] orientation (this plane is hereinafter referred to as "[001] propagation θ rotation X plane"), and the propagation angle ψ in the [001] orientation is set to 0°. Changes that the acoustic velocity undergoes in relation to the propagation angle when θ is set to 0°, 15°, 30°, and 45° are shown in FIG. 14.

Figure 15:
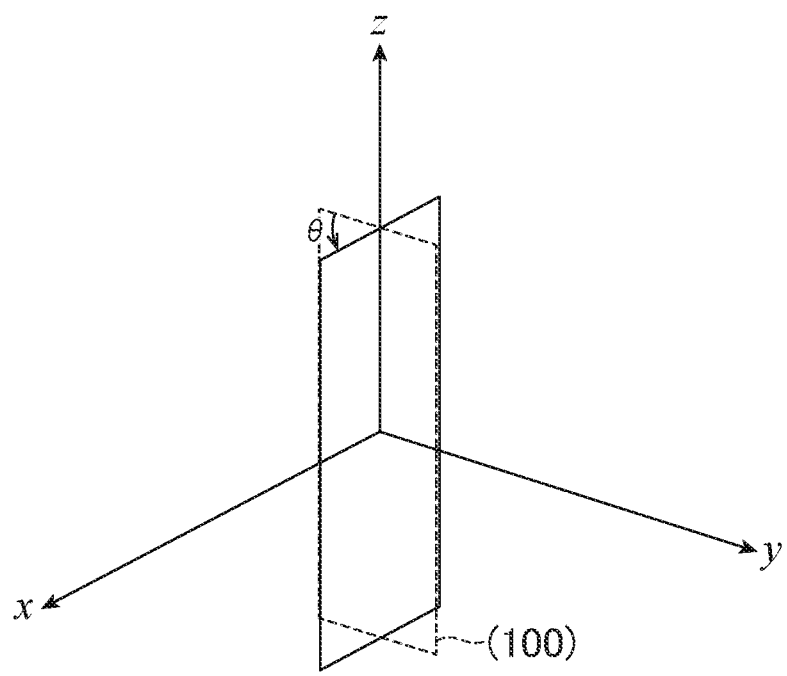
FIG. 15 is a diagram for illustrating the [001] propagation θ rotation X plane.
Figure 16:
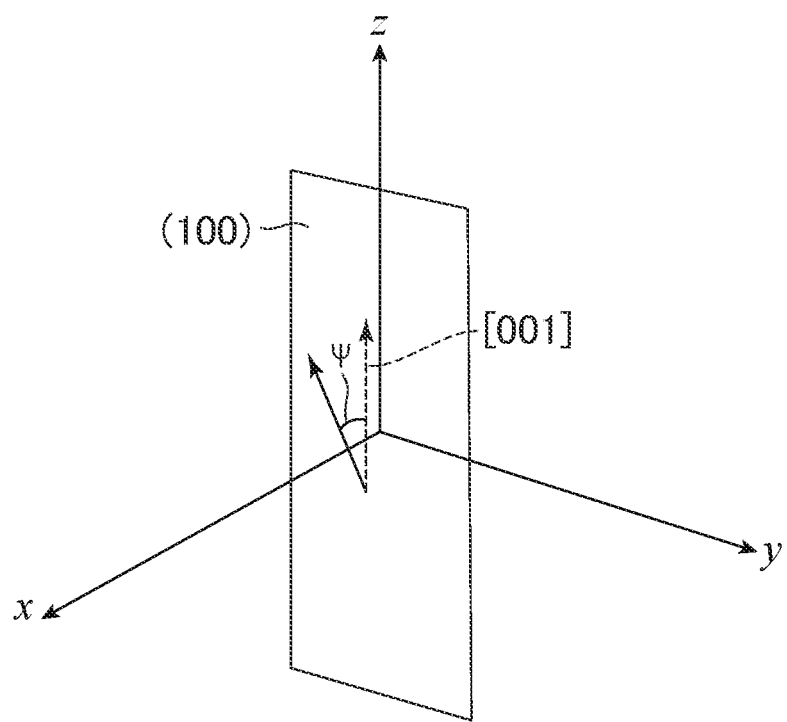
FIG. 16 is a diagram for illustrating the propagation angle ψ that is observed when gehlenite is cut on the [001] propagation θ rotation X plane.

FIG. 15 is a diagram for illustrating the [001] propagation θ rotation X plane. The [001] propagation θ rotation X plane is a plane that is represented by the solid line in FIG. 15 and that is obtained by rotating the (100) plane, which is represented by the broken line, counterclockwise by θ with respect to the [001] orientation as illustrated in FIG. 15. This plane is equal to the (100) plane when θ is 0°. This plane is equal to the (110) plane when θ is 45° and equal to the (010) plane when θ is 90°. The propagation angle ψ is 0° in the [001] orientation as illustrated in FIG. 16, and the counterclockwise direction in the cut plane is a positive direction (in FIG. 16, the (100) plane is illustrated as the cut plane).

Referring back to FIG. 14, the graph clearly shows that, also when the [001] propagation θ rotation X plane is used as the surface acoustic wave propagation plane 11, the acoustic velocity takes a local minimum value at a propagation angle ψ of 0° irrespective of the value of θ. The acoustic velocity and the curvature at the propagation angle ψ of 0° do not change much due to a change in the value of θ, and are generally constant.

Figure 17:
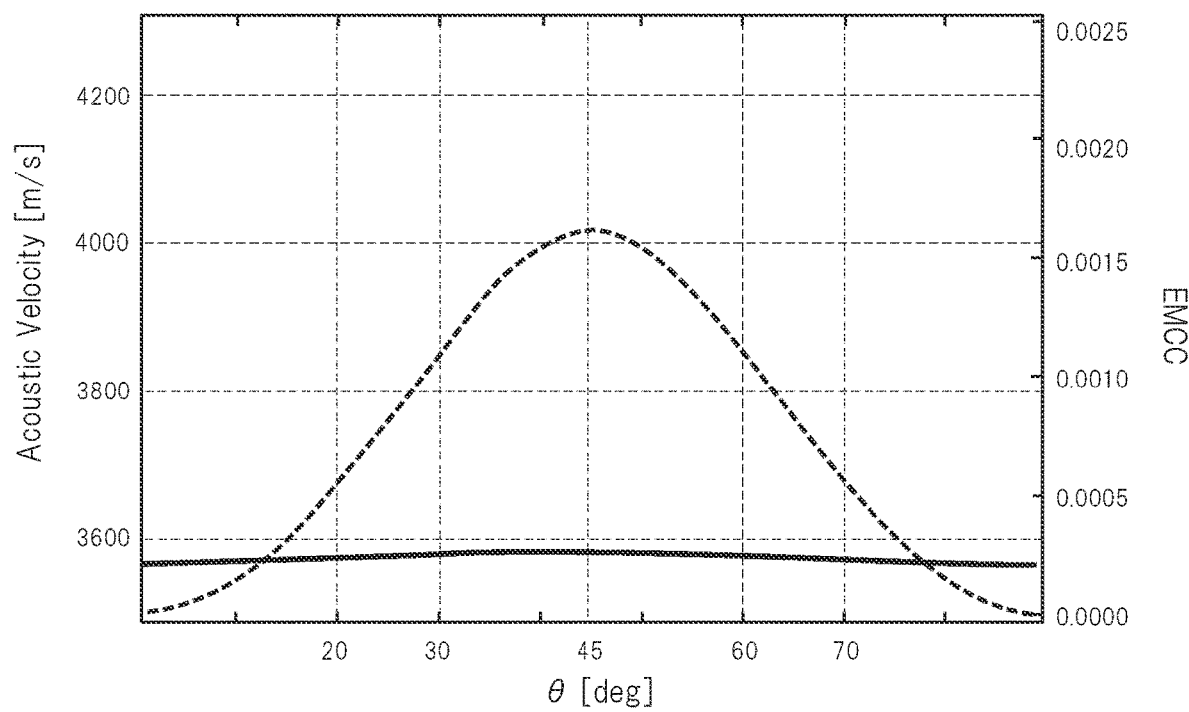
FIG. 17 is a graph for showing a relationship between θ and the acoustic velocity and a relationship between θ and the electromechanical coupling coefficient that are observed on the [001] propagation θ rotation X plane when the propagation angle is set to 0°.

FIG. 17 is a graph for showing a relationship between θ and the acoustic velocity and a relationship between θ and the electromechanical coupling coefficient that are observed on the [001] propagation θ rotation X plane when the propagation angle ψ is set to 0°. As shown in FIG. 17, the electromechanical coupling coefficient on the [100] propagation θ rotation X plane increases as θ increases from 0°, reaches a maximum value when θ is around 45°, and then decreases as θ approaches 90°.

Accordingly, in the case where the [001] propagation θ rotation X plane described here is used for a surface acoustic wave device that is demanded to have quick response, the range of θ is desirably 20°≤θ≤70°, more desirably 30°≤θ≤60°.

On the other hand, at some value of θ, the magnitude of the acoustic velocity and the magnitude of the loss hardly change on the [001] propagation θ rotation X plane. Accordingly, when the [001] propagation θ rotation X plane is used for a surface acoustic wave device that uses a standing wave generated by resonance and is not demanded to have quick response, it is recommended to select 20°≤θ≤70°, more desirably 30°≤θ≤60°, as a range of θ where the electromechanical coupling coefficient is higher, as in the case of the surface acoustic wave device described above that is demanded to have quick response.

Figure 18:
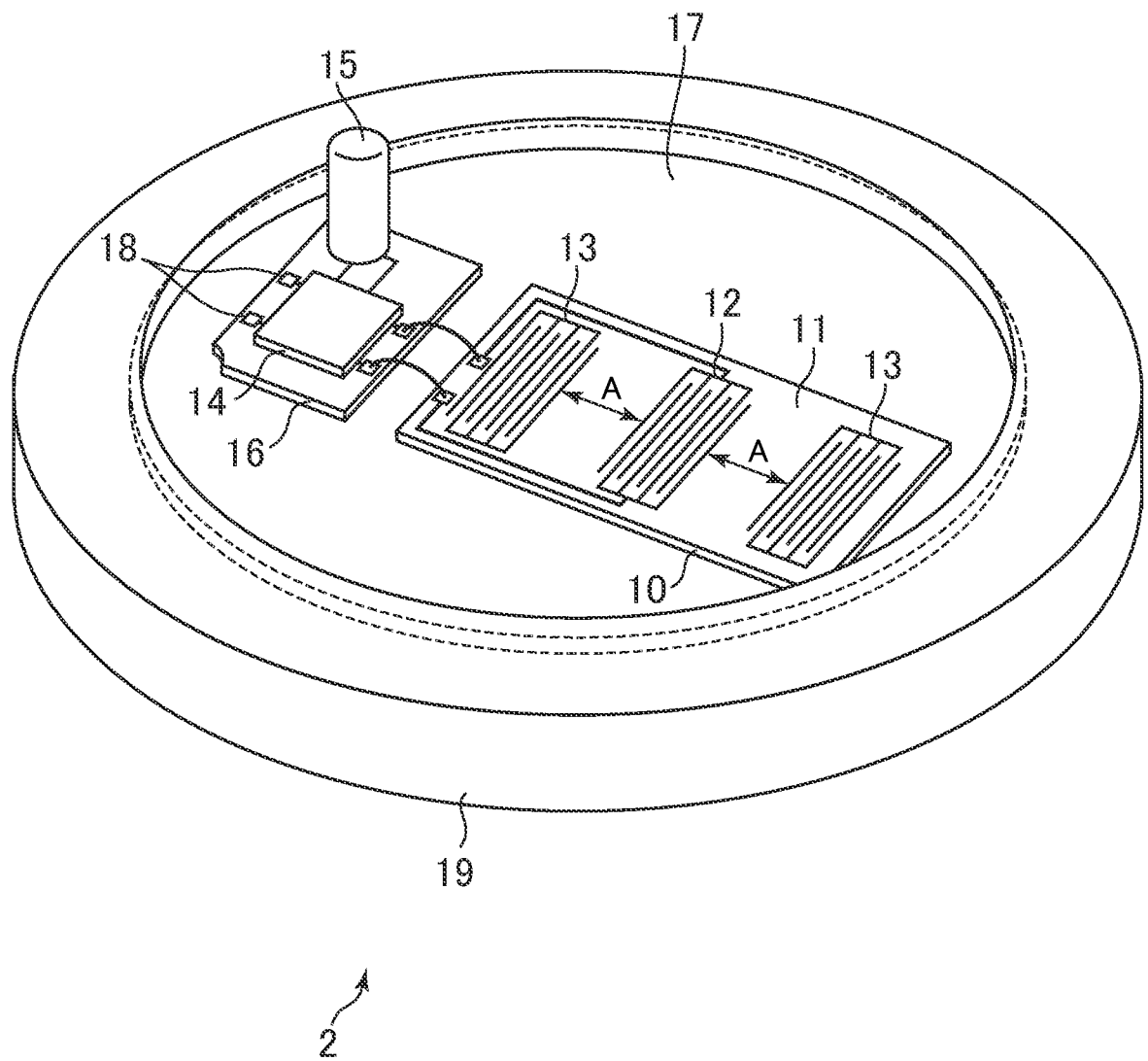
FIG. 18 is a perspective view of the exterior of a wireless pressure sensor, which is a surface acoustic wave device according to a second embodiment of the present invention.

Referring to FIG. 18, a second embodiment of the present invention is described next.

FIG. 18 is a perspective view of the exterior of a wireless pressure sensor 2, which is a surface acoustic wave device according to the second embodiment of the present invention. The wireless pressure sensor 2 is structured so that a base substrate 17 cut into a disc shape is held by a ring-shaped holding member 19. A piezoelectric substrate 10 and a mount substrate 16 are arranged on the base substrate 17. The base substrate 17 serves as a diaphragm to be deformed elastically in an amount that is determined by a difference in pressure between the front and back of the wireless pressure sensor 2. This brings about the bending deformation of the piezoelectric substrate 10, thereby changing the acoustic velocity of the surface acoustic wave. Measuring the resonance frequency of the surface acoustic wave on the piezoelectric substrate 10 by the same method that is described in the first embodiment can therefore be used to find out a force that has affected the base substrate 17, namely, the difference in pressure between the front and back of the wireless pressure sensor 2. The wireless pressure sensor 2 is mounted by fixing the holding member 19 to an opening in a space that is a measurement target by adhesion, bolting, or other suitable methods.

A surface of the piezoelectric substrate 10 serves as a surface acoustic wave propagation plane 11, on which an excitation electrode 12 and reflective electrodes 13 are provided as in the wireless temperature sensor 1 according to the first embodiment. The configuration of the mount substrate 16 is also the same as in the first embodiment. Components in the second embodiment that correspond to ones in the first embodiment are denoted by the same symbols, and duplicate descriptions thereof are omitted.

While the base substrate 17 serves as a diaphragm in the structure described in this example, another structure may be employed in which the piezoelectric substrate 10 itself functions as a diaphragm. In this case, a matching circuit 14 and an antenna 15 may be provided directly on the piezoelectric substrate 10, or the mount substrate 16 may further be provided on the piezoelectric substrate 10 to mount the matching circuit 14 and the antenna 15 on the mount substrate 16.

Similarly to the wireless temperature sensor 1 described above, the wireless pressure sensor 2 conducts measurement by exciting a standing wave on the surface acoustic wave propagation plane 11 of the piezoelectric substrate 10 and then receiving an electromagnetic wave that is emitted from the antenna 15. The acoustic velocity of the piezoelectric substrate 10 in this case changes under the influence of a strain of the piezoelectric substrate 10. The strain of the piezoelectric substrate 10 can therefore be known by finding out the resonance frequency of the wireless pressure sensor 2 from the electromagnetic wave that is emitted from the antenna 15, and further finding out the acoustic velocity of the piezoelectric substrate 10. The strain of the piezoelectric substrate 10 is deemed as a reflection of a strain of the base substrate 17 and, because the mechanical characteristics of the base substrate 17 are known information, it is easy to obtain a difference in pressure between the inside and outside of the piezoelectric substrate 10 from the strain of the piezoelectric substrate 10.

Also in the wireless pressure sensor 2, using a gehlenite monocrystal as the piezoelectric substrate 10 provides resistance to a high-temperature environment and enables the wireless pressure sensor 2 to use a 2 GHz to 2.5 GHz band or higher. In addition, the piezoelectric substrate 10 can be supplied steadily and inexpensively as in the wireless temperature sensor 1 described above, and the surface acoustic wave propagation plane 11 and the surface acoustic wave traveling direction are selected in the same manner as in the wireless temperature sensor 1.

Figure 19:
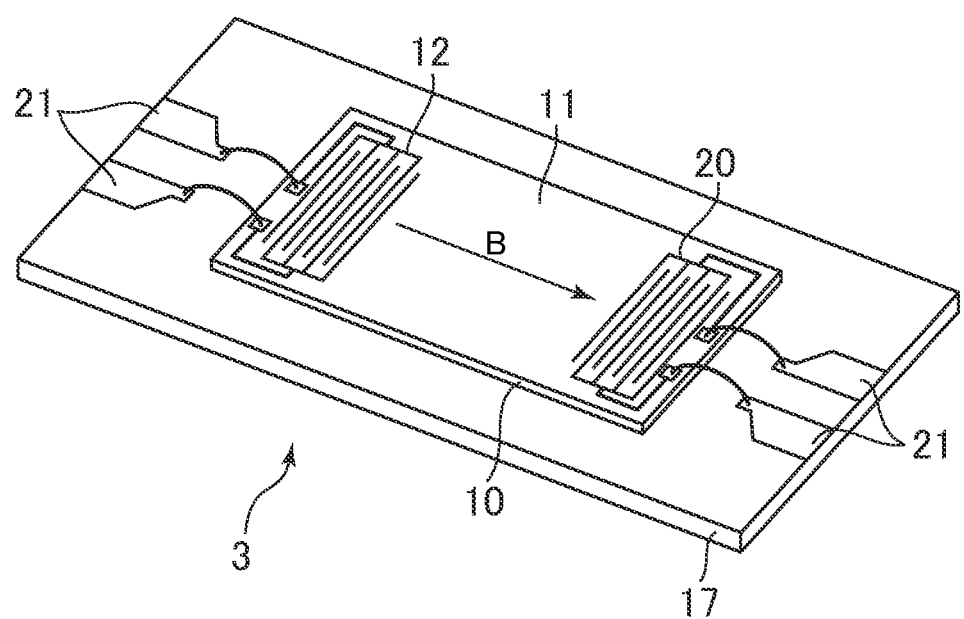
FIG. 19 is a perspective view of the exterior of a filter, which is a surface acoustic wave device according to a third embodiment of the present invention.

Referring to FIG. 19, a third embodiment of the present invention is described next.

FIG. 19 is a perspective view of the exterior of a filter 3, which is a surface acoustic wave device according to the third embodiment of the present invention. The filter 3 is a wave filter having pass band characteristics as a band pass filter. An excitation electrode 12 is formed at one end of a surface acoustic wave propagation plane 11 on a piezoelectric substrate 10, and a receiving electrode 20 is formed at the other end of the surface acoustic wave propagation plane 11 as interdigital transducers. The piezoelectric substrate 10 is mounted on a base substrate 17. Terminals 21, the excitation electrode 12, and the receiving electrode 20 are provided on the base substrate 17, and are connected by a suitable method, for example, wire bonding.

In the filter 3, when electric power is input from one of the terminals 21 on the excitation electrode 12 side, a signal in a frequency band that is determined by the pitch of the interdigitai transducer and the acoustic velocity on the surface acoustic wave propagation plane 11 is propagated as a surface acoustic wave in a direction B in FIG. 19. The propagated signal is received by the receiving electrode 20 and is output from one of the terminals 21 on the excitation electrode 12 side. The filter 3, which is described as what is called a transversal SAW filter in the third embodiment, may instead be designed as an SAW resonator filter, and a ladder-type electrode arrangement and various other electrode arrangements can be employed instead of the simple opposed type described here.

Also in the filter 3, using a gehlenite monocrystal as the piezoelectric substrate 10 provides resistance to a high-temperature environment and enables the filter 3 to use a 2 GHz to 2.5 GHz band or higher. In addition, the piezoelectric substrate 10 can be supplied steadily and inexpensively as in the wireless temperature sensor 1 described above, and the surface acoustic wave propagation plane 31 and the surface acoustic wave traveling direction are selected in the same manner as in the wireless temperature sensor 1.

The specific configurations that are given in the embodiments described above are presented merely as examples, and the inventions disclosed herein are not to be limited to the exact configurations of the specific examples. A person skilled in the art may make various modifications to the disclosed embodiments by, for example, changing the shape of a member or a part of a member suitably, changing the number of pieces of a member or a part of a member suitably, or combining the exemplary embodiments with one another. The surface acoustic wave devices disclosed herein may be applied to sensors configured to measure physical quantities other than temperature and pressure, and to electric devices other than filters. It is to be understood that the technical scope of the invention disclosed herein encompasses such modifications.

The invention claimed is:

1. A surface acoustic wave device, comprising:
a piezoelectric substrate formed from a monocrystal of gehlenite (CAS: Ca2Al(AlSi)O7); and
an interdigital transducer formed on a surface acoustic wave propagation plane of the piezoelectric substrate;
wherein the surface acoustic wave propagation plane comprises a plane that is obtained by rotating a (001) plane by an angle θ with respect to a [110] orientation, a surface acoustic wave traveling direction comprises the [110] orientation, and the angle θ satisfies 0°≤θ≤80°.

2. A surface acoustic wave device, comprising:
a piezoelectric substrate formed from a monocrystal of gehlenite (CAS: Ca2Al(AlSi)O7); and
an interdigital transducer formed on a surface acoustic wave propagation plane of the piezoelectric substrate;
wherein the surface acoustic wave propagation plane comprises a plane that is obtained by rotating a (001) plane by an angle θ with respect to a [100] orientation, a surface acoustic wave traveling direction comprises the [100] orientation, and the angle θ satisfies 40°≤θ≤75°.

3. A surface acoustic wave device, comprising:
a piezoelectric substrate formed from a monocrystal of gehlenite (CAS: Ca2Al(AlSi)O7); and
an interdigital transducer formed on a surface acoustic wave propagation plane of the piezoelectric substrate;
wherein the surface acoustic wave propagation plane comprises a plane that is obtained by rotating a (100) plane by an angle θ with respect to a [001] orientation, a surface acoustic wave traveling direction comprises the [001] orientation, and the angle θ satisfies 20°≤θ≤70°.

* * * * *